(12) United States Patent
   Tian

(10) Patent No.: US 11,101,301 B2
(45) Date of Patent: Aug. 24, 2021

(54) ARRAY SUBSTRATE AND MANUFACTURING METHOD THEREFOR, DISPLAY PANEL AND DISPLAY APPARATUS

(71) Applicant: BOE Technology Group Co., Ltd., Beijing (CN)

(72) Inventor: Xueyan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/320,272

(22) PCT Filed: May 10, 2018

(86) PCT No.: PCT/CN2018/086384
§ 371 (c)(1),
(2) Date: Jan. 24, 2019

(87) PCT Pub. No.: WO2018/233395
PCT Pub. Date: Dec. 27, 2018

(65) Prior Publication Data
US 2019/0172856 A1    Jun. 6, 2019

(30) Foreign Application Priority Data
Jun. 20, 2017    (CN) .......................... 201710468730.8

(51) Int. Cl.
*H01L 27/12*    (2006.01)
*H01L 21/02*    (2006.01)
(Continued)

(52) U.S. Cl.
CPC ...... *H01L 27/1285* (2013.01); *H01L 21/0262* (2013.01); *H01L 21/02422* (2013.01);
(Continued)

(58) Field of Classification Search
CPC ............. H01L 27/1222; H01L 27/3262; H01L 27/3218; H01L 27/326; H01L 29/78672;
(Continued)

(56) References Cited

U.S. PATENT DOCUMENTS 4,965,565 A * 10/1990 Noguchi ............... G02F 1/1368
345/93
2005/0169660 A1    8/2005 Hongo et al.
(Continued)

FOREIGN PATENT DOCUMENTS

CN    1649109 A    8/2005
CN    1963609 A    5/2007
(Continued)

OTHER PUBLICATIONS

Office Action for corresponding Chinese Application 201710468730.8 dated May 8, 2019.
(Continued)

*Primary Examiner* — Natalia A Gondarenko
(74) *Attorney, Agent, or Firm* — Arent Fox LLP; Michael Fainberg

(57) ABSTRACT

Disclosed are an array substrate and a manufacturing method therefor, a display panel and a display apparatus. The array substrate comprises several pixel units located on a base substrate and arranged in an array, with each of the pixel units comprising a thin-film transistor, and the thin-film transistor comprising a polycrystalline silicon active layer, wherein a length extension direction of a channel of the thin-film transistor is parallel to a pre-set direction; and the pre-set direction is a scanning direction of an excimer laser beam used when forming the polycrystalline silicon active layer.

7 Claims, 3 Drawing Sheets

(51) Int. Cl.
*H01L 29/786* (2006.01)
*H01L 29/66* (2006.01)
*H01L 27/32* (2006.01)
*G02F 1/1368* (2006.01)

(52) U.S. Cl.
CPC .. *H01L 21/02488* (2013.01); *H01L 21/02502* (2013.01); *H01L 21/02532* (2013.01); *H01L 21/02661* (2013.01); *H01L 21/02686* (2013.01); *H01L 27/1222* (2013.01); *H01L 29/6675* (2013.01); *H01L 29/78672* (2013.01); *H01L 29/78696* (2013.01); *G02F 1/1368* (2013.01); *G02F 2202/104* (2013.01); *H01L 21/02592* (2013.01); *H01L 21/02595* (2013.01); *H01L 27/1296* (2013.01); *H01L 27/3262* (2013.01)

(58) Field of Classification Search
CPC ........... H01L 29/66742; H01L 29/6675; H01L 29/66757; H01L 29/78675; H01L 21/02661; H01L 21/02422; H01L 21/02488; H01L 21/02502; H01L 21/02532; H01L 21/0262; H01L 21/02595; H01L 21/02592; H01L 27/12–1255; H01L 27/1259–1296; H01L 27/127–1285; H01L 27/32–3274; H01L 29/786–78696; H01L 29/78651–78678; H01L 21/268–2686; H01L 2021/60112; H01L 2021/60292; H01L 2021/775; H01L 21/02354; H01L 21/02675–02686; H01L 21/0275; H01L 21/0268; G02F 2202/104; G02F 1/1368; G02F 1/136286; G02F 1/13306; G02F 1/136277; C09G 3/3648; C09G 3/3225; C09G 3/3674
USPC .......................... 257/99, 72, 40, 98; 438/149
See application file for complete search history.

(56) References Cited

U.S. PATENT DOCUMENTS

| | | | |
|---|---|---|---|
| 2006/0132668 A1 | 6/2006 | Park et al. | |
| 2006/0240608 A1* | 10/2006 | Kim | B23K 26/0673 438/149 |
| 2015/0198850 A1* | 7/2015 | Tasaka | H01L 29/78696 349/46 |
| 2016/0275888 A1* | 9/2016 | Chen | G09G 3/3225 |
| 2017/0236705 A1* | 8/2017 | Li | H01L 21/02488 438/166 |
| 2019/0172856 A1 | 6/2019 | Tian | |

FOREIGN PATENT DOCUMENTS

| | | | | |
|---|---|---|---|---|
| CN | 105097453 A | * | 11/2015 | ....... H01L 21/02532 |
| CN | 105097453 A | | 11/2015 | |
| CN | 105185839 A | | 12/2015 | |
| CN | 106229254 A | | 12/2016 | |
| CN | 107104112 A | | 8/2017 | |

OTHER PUBLICATIONS

International Search Report for PCT/CN2018/086384 dated Aug. 8, 2018.

* cited by examiner

ARRAY SUBSTRATE AND MANUFACTURING METHOD THEREFOR, DISPLAY PANEL AND DISPLAY APPARATUS

This application is a National Stage of International Application No. PCT/CN2018/086384, filed May 10, 2018, which claims priority of Chinese Patent Application No. 201710468730.8, entitled "Array Substrate and Manufacturing Method therefor, Display Panel and Display Apparatus" and filed to the China Patent Office on Jun. 20, 2017, both of which are hereby incorporated by reference in their entireties.

FIELD

The present disclosure relates to the field of display technologies, and in particular to an array substrate and a manufacturing method therefor, a display panel and a display apparatus.

BACKGROUND

A low temperature poly-silicon (LTPS) thin film transistor liquid crystal display (TFT-LCD) panel has the advantages of high resolution, fast reaction, high brightness, high aperture ratio, etc. Since the LTPS TFT-LCD is in better order of silicon crystal arrangement compared with amorphous silicon (A-Si), its electron mobility is relatively higher than the electron mobility of A-Si by 100 times or more, and a peripheral driving circuit can be manufactured on a glass substrate at the same time, so that the space and the cost of a driving integrated circuit are saved and reduced. In the meanwhile, an active matrix organic light emitting diode (AMOLED) derived from LTPS has become the best choice for future display technology due to its advantages of high definition, short response time for moving images, low power consumption, wide viewing angle and the ultra-thin property.

SUMMARY

An array substrate provided by some embodiments of the present disclosure includes a plurality of pixel units which are on a substrate and arranged in an arrayed manner; each of the pixel units includes a thin film transistor; the thin film transistor includes a poly-silicon active layer, wherein a length extension direction of a channel of the thin film transistor is parallel to a preset direction;

the preset direction is a scanning direction of an excimer laser beam utilized when the poly-silicon active layer is formed.

Optionally, the thin film transistors in a same column of pixel units are arrayed in a manner that sets a displacement distance among the thin film transistors in a row direction of the pixel units.

Optionally, the thin film transistors in a same row of pixel units are arrayed in a manner that sets a displacement distance among the thin film transistors in a column direction of the pixel units.

Optionally, a cross section of the poly-silicon active layer is S-shaped or Z-shaped.

Some embodiments of the present disclosure further provide a display panel, including the array substrate mentioned above.

Some embodiment of the present disclosure further provide a display device, including the display panel mentioned above.

Optionally, the display device is a liquid crystal display device, or an organic electroluminescence display device.

Some embodiments of the present disclosure further provide a manufacturing method of the array substrate, including manufacturing a thin film transistor on a substrate, wherein the manufacturing the thin film transistor includes manufacturing a poly-silicon active layer, and the manufacturing a poly-silicon active layer comprises:

forming an amorphous silicon layer on the substrate, and forming a first amorphous silicon layer and a second amorphous silicon layer by utilizing a patterning process, wherein a position of the first amorphous silicon layer corresponds to a position of a channel of the thin film transistor; and performing annealing treatment on the first amorphous silicon layer and the second amorphous silicon layer by utilizing the excimer laser beam simultaneously to obtain a first poly-silicon active layer and a second poly-silicon active layer, wherein the extension direction of the first amorphous silicon layer in a preset direction is parallel to the scanning direction of the excimer laser beam.

Optionally, before the performing annealing treatment on the first amorphous silicon layer and the second amorphous silicon layer by utilizing an excimer laser beam simultaneously, the manufacturing the thin film transistor further comprises:

heating on the first amorphous silicon layer and the second amorphous silicon layer at 400-450 DEG C. for 0.5-3 h.

Optionally, a pulse frequency of the excimer laser beam is 250-350 Hz, a overlapping ratio of the excimer laser beam is 92-98%, a scanning rate of the excimer laser beam is 2.4-9.6 mm/s, and a energy density of the excimer laser beam is 300-500 mJ/cm$^2$.

DETAILED DESCRIPTION OF THE EMBODIMENTS

Figure 1:
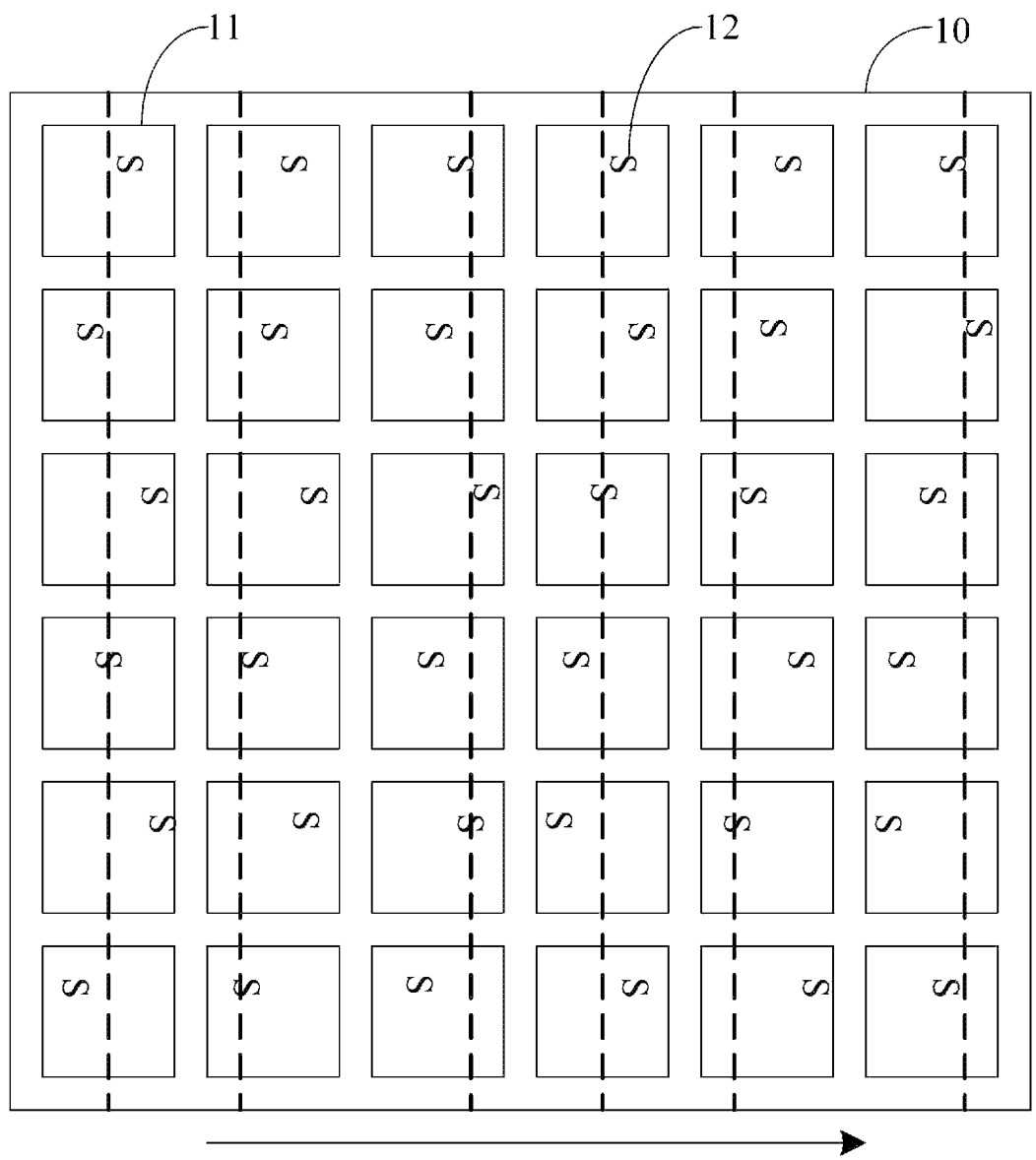
FIG. 1 is a structure diagram of an array substrate provided by an embodiment of the present disclosure.

The embodiments of the present disclosure provide an array substrate and a manufacturing method thereof, a display panel and a display device, so as to reduce the visual defect of displaying Mura and improve the quality and yield of the array substrate.

To make the objectives, technical solutions and advantages of the present disclosure clearer, the present disclosure will be described below in detail in combination with accompanying drawings. Apparently, the embodiments described below are merely a part, but not all, of the embodiments of the present disclosure. All of the other embodiments, obtained by those having ordinary skill in the art based on the embodiments of the present disclosure without any inventive efforts, fall into the protection scope of the present disclosure.

The array substrate provided by some embodiments of the present disclosure will be described in detail with accompanying drawings.

Thicknesses, area sizes and shapes of components in the drawings do not reflect true scales of the components, but are only intended to illustrate the contents of the present disclosure.

As shown in FIG. 1, some embodiments of the present disclosure provide an array substrate, including a plurality of pixel units 11 located on a substrate 10 and arranged in an arrayed manner; each pixel unit 11 includes a thin film transistor 12; the thin film transistor 12 includes a poly-silicon active layer (not shown in the figure); length extension directions of channels of the thin film transistors 12 in some embodiments of the present disclosure are parallel to a preset direction, wherein the preset direction is a scanning direction of an excimer laser beam utilized when the poly-silicon active layers are formed; this direction is shown as an arrow in FIG. 1; and a vertical dashed line in FIG. 1 indicates an edge line of the excimer laser beam during scanning.

Since the length extension directions of the channels of the thin film transistors in some embodiments of the present disclosure are parallel to the scanning direction of the excimer laser beam, compared with the related art, some embodiments of the present disclosure can eliminate the performance difference influence caused by high periodic coincidence between the length extension directions of the channels of the thin film transistors and an edge line of the excimer laser beam during scanning, the visual defect of displaying Mura caused by ELA linear Mura is reduced, and thus the quality and yield of the array substrate are improved.

Optionally, cross sections of the poly-silicon active layers included in the thin film transistors in some embodiments of the present disclosure are S-shaped or Z-shaped; the cross sections here refer to surfaces which are perpendicular to the substrate and point from sources to drains of the thin film transistors; certainly, in an actual production process, the cross sections of the poly-silicon active layers can also be bent into other shapes; and the cross sections of the poly-silicon active layers in the specific embodiment of the present disclosure are S-shaped or Z-shaped, so that the length extension directions of the channels of the thin film transistors are better parallel to the scanning direction of the excimer laser beam.

Optionally, as shown in FIG. 1, the thin film transistors 12 located in the same column of pixel units 11 in some embodiments of the present disclosure are arranged in a staggered manner, that is, there is a displacement distance among the thin film transistors in a row direction of the pixel units, so that the performance difference influence caused by high periodic coincidence between the length extension directions of the channels of the thin film transistors and the edge line of the excimer laser beam during scanning is further eliminated, and control on zero Mura display is fundamentally achieved.

Figure 2:
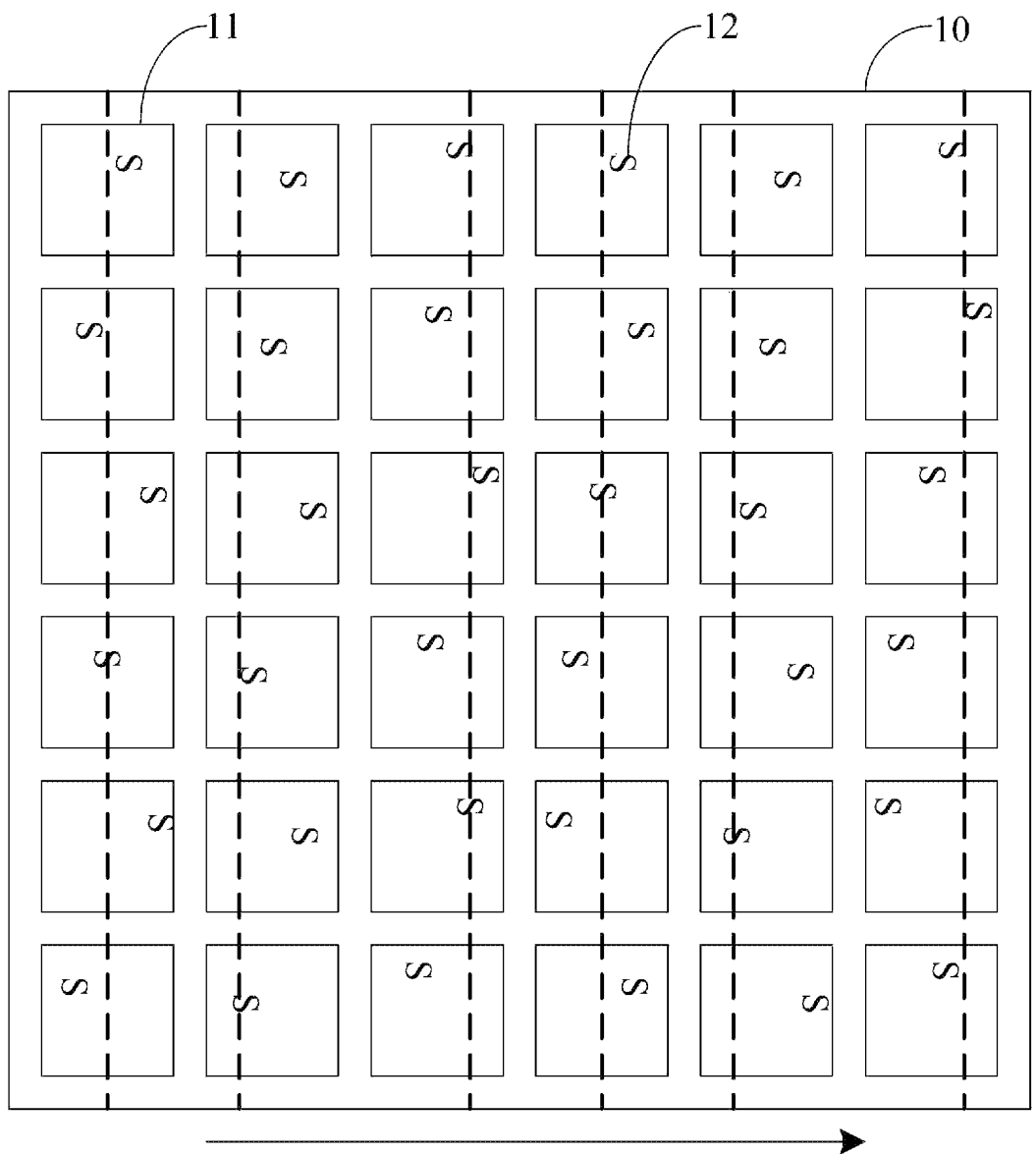
FIG. 2 is a structure diagram of another array substrate provided by an embodiment of the present disclosure.

Optionally, as shown in FIG. 2, the thin film transistors 12 located in the same row of pixel units 11 in some embodiments of the present disclosure are arranged in a staggered manner, that is, there is a displacement distance among the thin film transistors in a column direction of the pixel units, so that the arrangement mode of the thin film transistors in the specific embodiment of the present disclosure is more flexible and changeable, and the arrangement of the thin film transistors is further facilitated in the actual production process.

Based on the same inventive concept, some embodiments of the present disclosure further provide a display panel, including the array substrate provided by some embodiments of the present disclosure. As the arrangement mode of the thin film transistors included in the array substrate in some embodiments of the present disclosure can reduce the visual defect of displaying Mura caused by ELA linear Mura, the display panel provided by some embodiments of the present disclosure can greatly reduce the visual defect of displaying Mura compared with the related art.

Based on the same inventive concept, some embodiments of the present disclosure further provide a display device, including the display panel provided by some embodiments of the present disclosure; the display panel is a liquid crystal display device or an organic electroluminescence display device; and optionally, the display device is any product or component with a display function, such as a mobile phone, a tablet computer, a liquid crystal television, an organic light emitting diode (OLED) television, a notebook computer, a digital photo frame and a navigator. It should be understood by those having ordinary skill in the art that the display device has other essential components, which will not be described here.

Figure 3:
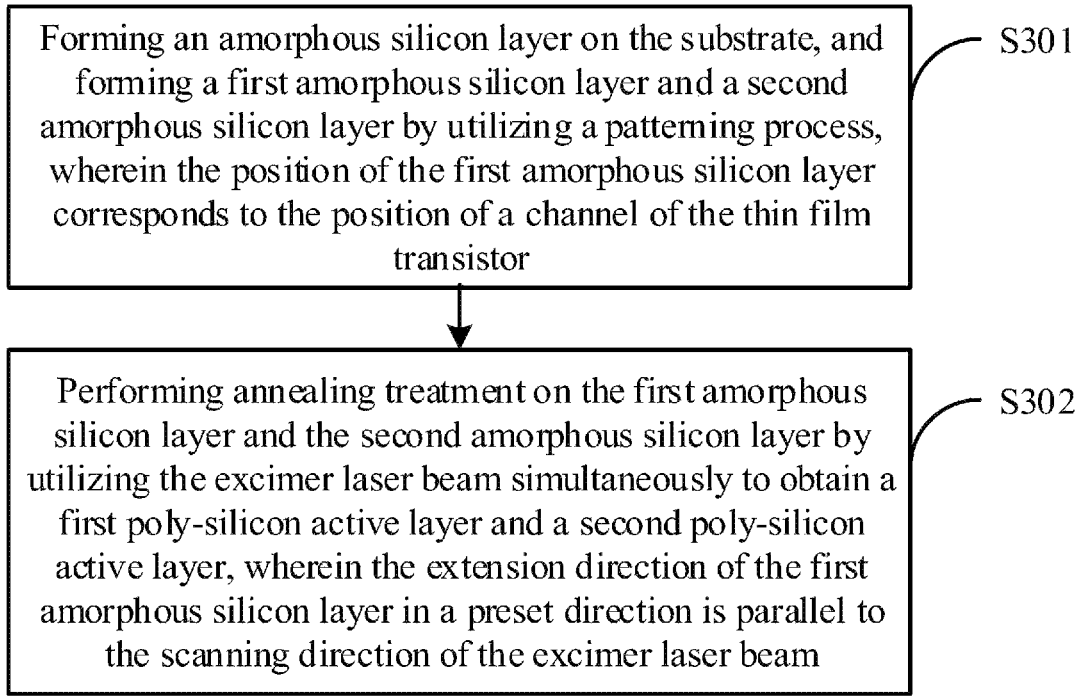
FIG. 3 is a flow chart of a manufacturing method of an array substrate provided by an embodiment of the present disclosure.

Based on the same inventive concept, some embodiments of the present disclosure further provide a manufacturing method of the array substrate, including a method of manufacturing a thin film transistor on a substrate, wherein the method of manufacturing the thin film transistor includes a method of manufacturing a poly-silicon active layer, and as shown in FIG. 3, includes the steps of:

S301, forming an amorphous silicon layer on the substrate, and forming a first amorphous silicon layer and a second amorphous silicon layer by utilizing a patterning process, wherein the position of the first amorphous silicon layer corresponds to the position of a channel of the thin film transistor; and S302, performing annealing treatment on the first amorphous silicon layer and the second amorphous silicon layer by utilizing the excimer laser beam simultaneously to obtain a first poly-silicon active layer and a second poly-silicon active layer, wherein the extension direction of the first amorphous silicon layer in a preset direction is parallel to the scanning direction of the excimer laser beam.

The extension direction of the first amorphous silicon layer in the preset direction in the specific embodiment of the present disclosure refers to a length extension direction of a channel of the formed thin film transistor; and after the thin film transistor is formed, the specific determination way of the length extension direction of the channel of the thin film transistor is similar to that in the related art, and will not be described here.

Optionally, before the step of performing annealing treatment on the first amorphous silicon layer and the second amorphous silicon layer by utilizing an excimer laser beam simultaneously, the manufacturing method further includes the step of heating the first amorphous silicon layer and the second amorphous silicon layer at 400-450 DEG C. for 0.5 to 3 h, so that the amorphous silicon layers can be better formed into a poly-silicon active layer after annealing is performed by utilizing the excimer laser beam subsequently.

Optionally, when the annealing treatment is carried out by utilizing the excimer laser beam in some embodiments of the present disclosure, the pulse frequency of laser is 250-350 Hz, the overlapping ratio of laser is 92-98%, the scanning rate of laser is 2.4-9.6 mm/s, and the energy density of laser is 300-500 mJ/cm$^2$. The formula for calculating the overlapping ratio of laser in some embodiments of the present disclosure is as follows:

the overlapping ratio of laser=[(width of light beam−scanning gap)/width of the light beam*100%.

The manufacturing method of the array substrate in some embodiments of the present disclosure will be described in detail with the combination of following example.

First, the substrate is pre-cleaned, wherein the substrate in some embodiments of the present disclosure takes a glass substrate as an example; next, buffer layers are manufactured on the substrate, wherein the buffer layers manufactured according to some embodiments of the present disclosure are described by taking a double-layer structure as an example; optionally, a silicon nitride (SiN) layer of 50-150 nm and then a silicon dioxide (SiO2) layer of 100-350 nm are deposited by adopting a plasma enhanced chemical vapor deposition (PECVD) method, wherein the SiN layer and SiO2 layer act as the buffer layers in some embodiments of the present disclosure; and it should be noted that it is an optional solution to manufacture the buffer layers, and the buffer layers may be not manufactured in other embodiments.

Next, an amorphous silicon layer is deposited on the substrate on which the buffer layers are manufactured, and in some embodiments, an amorphous silicon layer of 30-60 nm is deposited by adopting the PECVD method; and then, a first amorphous silicon layer and a second amorphous silicon layer are formed by utilizing a patterning process, wherein the position of the first amorphous silicon layer corresponds to the position needing to form a channel of the thin film transistor; the patterning process in some embodiments of the present disclosure includes some or all of the processes of photoresist coating, exposure, development, etching and photoresist removal; when the amorphous silicon layer is patterned by the patterning process in some embodiments of the present disclosure, the extension direction of the first amorphous silicon layer formed after patterning in the preset direction needs to be parallel to the scanning direction of the excimer laser beam in the subsequent annealing process utilizing the excimer laser beam, so as to eliminate the performance difference influence caused by high periodic coincidence between the length extension directions of the channels of the thin film transistors and the edge line of the excimer laser beam during scanning.

Optionally, when the patterning process is performed in some embodiments of the present disclosure, the first amorphous silicon layers to be formed in the same column of pixel units can be arranged in a staggered manner, that is, there is a displacement distance among the thin film transistors in a row direction of the pixel units, so that the subsequently formed thin film transistors in each pixel unit are not placed in a periodic arrangement mode, but placed in a non-periodic and staggered mode, which can further eliminate the performance difference influenced caused by high periodic coincidence between the length extension directions of the channels of the thin film transistors and the edge line of the excimer laser beam during scanning, and fundamentally achieve control on zero Mura display.

Next, the first amorphous silicon layer and the second amorphous silicon layer are heated for 0.5-3 h, and then are subjected to an excimer laser annealing process to obtain a first poly-silicon active layer and a second poly-silicon active layer, and the formed first poly-silicon active layer and the second poly-silicon active layer constitute an active layer of the thin film transistor of some embodiments of the present disclosure.

Optionally, when the annealing treatment is carried out by utilizing the excimer laser beam in some embodiments of the present disclosure, the pulse frequency of laser is 250-350 Hz, the overlapping ratio of laser is 92-98%, the scanning rate of laser is 2.4-9.6 mm/s, and the energy density of laser is 300-500 mJ/cm$^2$; and in some embodiments, when excimer laser annealing is performed in some embodiments of the present disclosure, a xenon chloride excimer laser with a wavelength of 308 nm is used, certainly, other types of lasers such as an argon fluoride excimer laser can also be used in the actual production process, and the specific type of the excimer laser is not limited by some embodiments of the present disclosure.

Finally, a source, a drain, an interlayer insulating layer, a pixel electrode and other structures are formed on the formed first poly-silicon active layer and the formed second poly-silicon active layer, and specific manufacturing methods of this part of the film layers do not involve the improvements of the present disclosure, and thus will not be described here.

The thin film transistors and the array substrate formed by the method in some embodiments of the present disclosure are suitable for a low temperature poly-silicon active matrix organic light emitting diode display (LTPS-AMOLED), a low temperature poly-silicon thin film transistor liquid crystal display (LTPS TFT-LCD) and other fields.

To sum up, the array substrate provided by some embodiments of the present disclosure includes a plurality of pixel units located on a substrate and arranged in an arrayed manner; each pixel unit includes a thin film transistor; the thin film transistor includes a poly-silicon active layer, wherein length extension direction of channel of the thin film transistor is parallel to a preset direction; and the preset direction is the scanning direction of an excimer laser beam utilized when the poly-silicon active layer is formed. Since the length extension direction of the channel of the thin film transistor in some embodiments of the present disclosure is parallel to the scanning direction of the excimer laser beam, compared with the related art, some embodiments of the present disclosure can eliminate the performance difference influence caused by high periodic coincidence between the length extension direction of the channel of the thin film transistor and an edge line of the excimer laser beam during scanning, the visual defect of displaying Mura caused by ELA linear Mura is reduced, and thus the quality and yield of the array substrate are improved.

It will be apparent to those skilled in the art that various modifications and variations can be made to the present disclosure without departing from the spirit and scope of the present disclosure. Thus, it is intended that the present disclosure covers the modifications and variations of this disclosure that come within the scope of the claims and their technical equivalents of this disclosure.

The invention claimed is:

1. An array substrate, comprising a plurality of pixel units which are on a substrate and arranged in an arrayed manner, each of the plurality of pixel units comprising a thin film transistor, the thin film transistor comprising a low temperature poly-silicon (LTPS), active layer, wherein a length extension direction of a channel of the thin film transistor is parallel to a preset direction;

the preset direction is a scanning direction of an excimer laser beam utilized to form the LTPS active layer;

wherein thin film transistors in a same column of pixel units are arrayed in a manner that sets a displacement distance among the thin film transistors in a row direction of the pixel units, and thin film transistors in a same row of pixel units are arrayed in a manner that sets a displacement distance among the thin film transistors in a column direction of the pixel units;

wherein the thin film transistors in each of the plurality of pixel units are not placed in a periodic arrangement mode.

2. A display panel, wherein the display panel comprises the array substrate of claim 1.

3. A display device, wherein the display device comprises the display panel of claim 2.

4. The display device of claim 3, wherein the display device is a liquid crystal display device, or an organic electroluminescence display device.

5. A manufacturing method of an array substrate, comprising manufacturing a thin film transistor on the array substrate of claim 1, wherein
the manufacturing the thin film transistor comprises manufacturing the LTPS active layer, the manufacturing the LTPS active layer comprises:
forming an amorphous silicon layer on the substrate, and forming a first amorphous silicon layer and a second amorphous silicon layer by utilizing a patterning process, wherein a position of the first amorphous silicon layer corresponds to a position of a channel of the thin film transistor; and
performing annealing treatment on the first amorphous silicon layer and the second amorphous silicon layer by utilizing an excimer laser beam simultaneously to obtain a first LTPS active layer and a second LTPS active layer, wherein an extension direction of the first amorphous silicon layer in a preset direction is parallel to a scanning direction of the excimer laser beam.

6. The manufacturing method of claim 5, wherein before the performing annealing treatment on the first amorphous silicon layer and the second amorphous silicon layer by utilizing an excimer laser beam simultaneously, further comprising:
heating the first amorphous silicon layer and the second amorphous silicon layer at 400-450 DEG C. for 0.5-3 h.

7. The manufacturing method of claim 5, wherein a pulse frequency of the excimer laser beam is 250-350 Hz, an overlapping ratio of the excimer laser beam is 92-98%, a scanning rate of the excimer laser beam is 2.4-9.6 mm/s, and an energy density of the excimer laser beam is 300-500 mJ/cm2.

* * * * *